(12) United States Patent
Morgan

(10) Patent No.: US 12,489,413 B1
(45) Date of Patent: Dec. 2, 2025

(54) POWER SPLITTER AND ASSOCIATED METHODS

(71) Applicant: CAES SYSTEMS LLC, Arlington, VA (US)

(72) Inventor: Denny Morgan, San Diego, CA (US)

(73) Assignee: CAES SYSTEMS LLC, Arlington, VA (US)

( * ) Notice: Subject to any disclaimer, the term of this patent is extended or adjusted under 35 U.S.C. 154(b) by 203 days.

(21) Appl. No.: 18/348,059

(22) Filed: Jul. 6, 2023

(51) Int. Cl.
*H03H 7/46* (2006.01)
*H03H 7/01* (2006.01)

(52) U.S. Cl.
CPC .......... *H03H 7/461* (2013.01); *H03H 7/0115* (2013.01); *H03H 7/1783* (2013.01); *H03H 7/46* (2013.01); *H03H 7/463* (2013.01)

(58) Field of Classification Search
CPC ...... H03H 7/0115; H03H 7/1783; H03H 7/46; H03H 7/463; H03H 7/461
USPC .......... 333/126, 129, 132, 175, 185
See application file for complete search history.

(56) References Cited

U.S. PATENT DOCUMENTS

| | | | | |
|---|---|---|---|---|
| 4,851,795 A | * | 7/1989 | Beckwith | H01P 5/16 333/100 |
| 11,189,902 B1 | * | 11/2021 | Merhav | H01P 5/16 |
| 2008/0042774 A1 | | 2/2008 | Talbot | |
| 2011/0181371 A1 | * | 7/2011 | Alkan | H04L 12/2838 333/132 |
| 2015/0091669 A1 | * | 4/2015 | Mizoguchi | H03H 7/1766 333/132 |
| 2019/0214700 A1 | * | 7/2019 | Wang | H01P 1/36 |

FOREIGN PATENT DOCUMENTS

EP 2062353 A1 5/2009

OTHER PUBLICATIONS

Becciolini, B., NXP, Freescale Semiconductor, "*Impedance Matching Networks Applied to RF Power Transistors*," Rev 1.1, Oct. 2005 (16 pages).
Microwaves101.com, Wilkinson Power Splitters, [retrieved from Internet Aug. 21, 2023] <https://www.microwaves101.com/encyclopedias/wilkinson-power-splitters> (3 pages).

(Continued)

*Primary Examiner* — Rakesh B Patel
(74) *Attorney, Agent, or Firm* — ALSTON & BIRD LLP

(57) ABSTRACT

An example power splitter and associated methods are provided herein. In some embodiments, the power splitter may include a first port. In some embodiments, the power splitter may include a plurality of second ports. In some embodiments, the power splitter may include one or more low pass elements. In this regard, the one or more low pass elements may include at least one series inductor and at least one shunt capacitor. In some embodiments, the power splitter may include one or more high pass elements. In this regard, the one or more high pass elements may include at least one series capacitor and at least one shunt inductor. In some embodiments, each of the one or more high pass elements and each of the one or more low pass elements is electrically connected to the first port and the plurality of second ports.

20 Claims, 6 Drawing Sheets

(56) References Cited

OTHER PUBLICATIONS

Microwaves101.com, Multistage Wilkinsons, [retrieved from Internet Aug. 21, 2023] <<https://www.microwaves101.com/encyclopedias/multistage-wilkinsons> (6 pages).
Microwaves101.com, Lumped Element Wilkinson Splitters, [retrieved from Internet Aug. 21, 2023], <https://www.microwaves101.com/encyclopedias/lumped-element-wilkinson-splitters> (3 pages).
Okada et al., "*Wideband Lumped-Element Wilkinson Power Dividers Using LC-Ladder Circuit*," Proceedings of the 45$^{th}$ European Microwave Conference, Sep. 7-10, 2015, Paris France (4 pages).

* cited by examiner

POWER SPLITTER AND ASSOCIATED METHODS

TECHNOLOGICAL FIELD

Embodiments of the present disclosure relate generally to a power splitter and associated methods.

BACKGROUND

Power splitters (e.g., power dividers and/or power combiners) are used in numerous electrical applications to divide an input signal into a plurality of output signals and/or combine a plurality of input signals into a combined output signal. In many electrical applications, it is desired that the power splitters have a small physical size, have wide bandwidth, and use minimal components. One such electrical application is in radio frequency (RF) or microwave circuit applications. For example, a power splitter may be used between an antenna and one or more other RF or microwave circuit components.

A power splitter that has a small physical size, has wide bandwidth, and uses minimal components can ensure that the power splitter can be used in numerous electrical applications in a cost-effective manner (e.g., cost-effective design and implementation). One conventional approach for power splitters includes constructing a power splitter out of transmission lines. However, transmission line-based power splitters that have wide bandwidth are large in size. Another conventional approach for power splitters includes constructing a power splitter out of lumped elements (e.g., low pass lumped elements or high pass lumped elements). However, lumped element-based power splitters typically include a large number of components and a narrow bandwidth. Accordingly, a power splitter having a small physical size, having wide bandwidth, and that uses minimal components, would be beneficial.

Through applied effort, ingenuity, and innovation, many of these identified problems have been solved by developing solutions that are included in embodiments of the present disclosure, many examples of which are described in detail herein.

BRIEF SUMMARY

Various embodiments described herein relate to a power splitter and associated methods the power splitter.

In accordance with one aspect of the disclosure, a power splitter is provided. In some embodiments, the power splitter may include a first port. In some embodiments, the power splitter may include a plurality of second ports. In some embodiments, the power splitter may include one or more low pass elements. In some embodiments, each of the one or more low pass elements comprises at least one series inductor and at least one shunt capacitor. In some embodiments, each of the one or more low pass elements is electrically connected to the first port and the plurality of second ports. In some embodiments, the power splitter may include one or more high pass elements. In some embodiments, each of the one or more high pass elements may include at least one series capacitor and at least one shunt inductor. In some embodiments, each of the one or more high pass elements is electrically connected to the first port and the plurality of second ports.

In some embodiments, the first port is configured to receive an input signal and each of the plurality of second ports is configured to output a plurality of output signals based on the input signal.

In some embodiments, the plurality of second ports is configured to receive a plurality of input signals and the first port is configured to output a combined signal based on the plurality of input signals.

In some embodiments, a number of high pass elements is equal to a number of low pass elements.

In some embodiments, a number of high pass elements is greater than a number of low pass elements.

In some embodiments, a number of high pass elements is less than a number of low pass elements.

In some embodiments, a bandwidth of the power splitter is based at least in part on a number of high pass elements and a number of low pass elements.

In some embodiments, the one or more high pass elements and the one or more low pass elements comprise monolithic microwave integrated circuits.

In some embodiments, at least one of the one or more high pass elements is proximate the first port and at least one of the one or more low pass elements is proximate at least one of the plurality of second ports.

In some embodiments, at least one of the one or more low pass elements is proximate the first port and at least one of the one or more high pass elements is proximate at least one of the plurality of second ports.

In accordance with another aspect of the disclosure, a method of manufacturing a power splitter is provided. In some embodiments, the method of manufacturing may include providing a first port. In some embodiments, the method of manufacturing may include providing a plurality of second ports. In some embodiments, the method of manufacturing may include providing one or more low pass elements. In some embodiments, each of the one or more low pass elements comprises at least one series inductor and at least one shunt capacitor. In some embodiments, each of the one or more low pass elements is electrically connected to the first port and the plurality of second ports. In some embodiments, the method of manufacturing may include providing one or more high pass elements. In some embodiments, each of the one or more high pass elements may include at least one series capacitor and at least one shunt inductor. In some embodiments, each of the one or more high pass elements is electrically connected to the first port and the plurality of second ports.

In some embodiments, the first port is configured to receive an input signal and each of the plurality of second ports is configured to output a plurality of output signals based on the input signal.

In some embodiments, the plurality of second ports is configured to receive a plurality of input signals and the first port is configured to output a combined signal based on the plurality of input signals.

In some embodiments, a number of high pass elements is equal to a number of low pass elements.

In some embodiments, a number of high pass elements is greater than a number of low pass elements.

In some embodiments, a number of high pass elements is less than a number of low pass elements.

In some embodiments, a bandwidth of the power splitter is based at least in part on a number of high pass elements and a number of low pass elements.

In some embodiments, the one or more high pass elements and the one or more low pass elements comprise monolithic microwave integrated circuits.

In some embodiments, at least one of the one or more high pass elements is proximate the first port and at least one of the one or more low pass elements is proximate at least one of the plurality of second ports.

In some embodiments, at least one of the one or more low pass elements is proximate the first port and at least one of the one or more high pass elements is proximate at least one of the plurality of second ports.

In accordance with another aspect of the disclosure, a method is provided. In some embodiments, the method may include receiving an input signal into a power splitter via a first port of the power splitter. In some embodiments, the method may include outputting a plurality of output signals based on the input signal from the power splitter via a plurality of second ports of the power splitter. In some embodiments, the power splitter may include one or more low pass elements, wherein each of the one or more low pass elements comprises at least one series inductor and at least one shunt capacitor, wherein each of the one or more low pass elements is electrically connected to the first port and the plurality of second ports. In some embodiments, the power splitter may include one or more high pass elements, wherein each of the one or more high pass elements comprises at least one series capacitor and at least one shunt inductor, wherein each of the one or more high pass elements is electrically connected to the first port and the plurality of second ports.

In some embodiments, a number of high pass elements is equal to a number of low pass elements.

In some embodiments, a number of high pass elements is greater than a number of low pass elements or a number of high pass elements is less than a number of low pass elements.

In some embodiments, a bandwidth of the power splitter is based at least in part on a number of high pass elements and a number of low pass elements.

In some embodiments, at least one of the one or more high pass elements is proximate the first port and at least one of the one or more low pass elements is proximate at least one of the plurality of second ports or at least one of the one or more low pass elements is proximate the first port and at least one of the one or more high pass elements is proximate at least one of the plurality of second ports.

In accordance with another aspect of the disclosure, a method is provided. In some embodiments, the method may include receiving a plurality of input signals into a power splitter via a plurality of second ports of the power splitter. In some embodiments, the method may include outputting a combined signal based on the plurality of input signals from the power splitter via a first port of the power splitter. In some embodiments, the power splitter may include one or more low pass elements, wherein each of the one or more low pass elements comprises at least one series inductor and at least one shunt capacitor, wherein each of the one or more low pass elements is electrically connected to the first port and the plurality of second ports. In some embodiments, the power splitter may include one or more high pass elements, wherein each of the one or more high pass elements comprises at least one series capacitor and at least one shunt inductor, wherein each of the one or more high pass elements is electrically connected to the first port and the plurality of second ports.

In some embodiments, a number of high pass elements is equal to a number of low pass elements.

In some embodiments, a number of high pass elements is greater than a number of low pass elements or a number of high pass elements is less than a number of low pass elements.

In some embodiments, a bandwidth of the power splitter is based at least in part on a number of high pass elements and a number of low pass elements.

In some embodiments, at least one of the one or more high pass elements is proximate the first port and at least one of the one or more low pass elements is proximate at least one of the plurality of second ports or at least one of the one or more low pass elements is proximate the first port and at least one of the one or more high pass elements is proximate at least one of the plurality of second ports.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Figure 1:
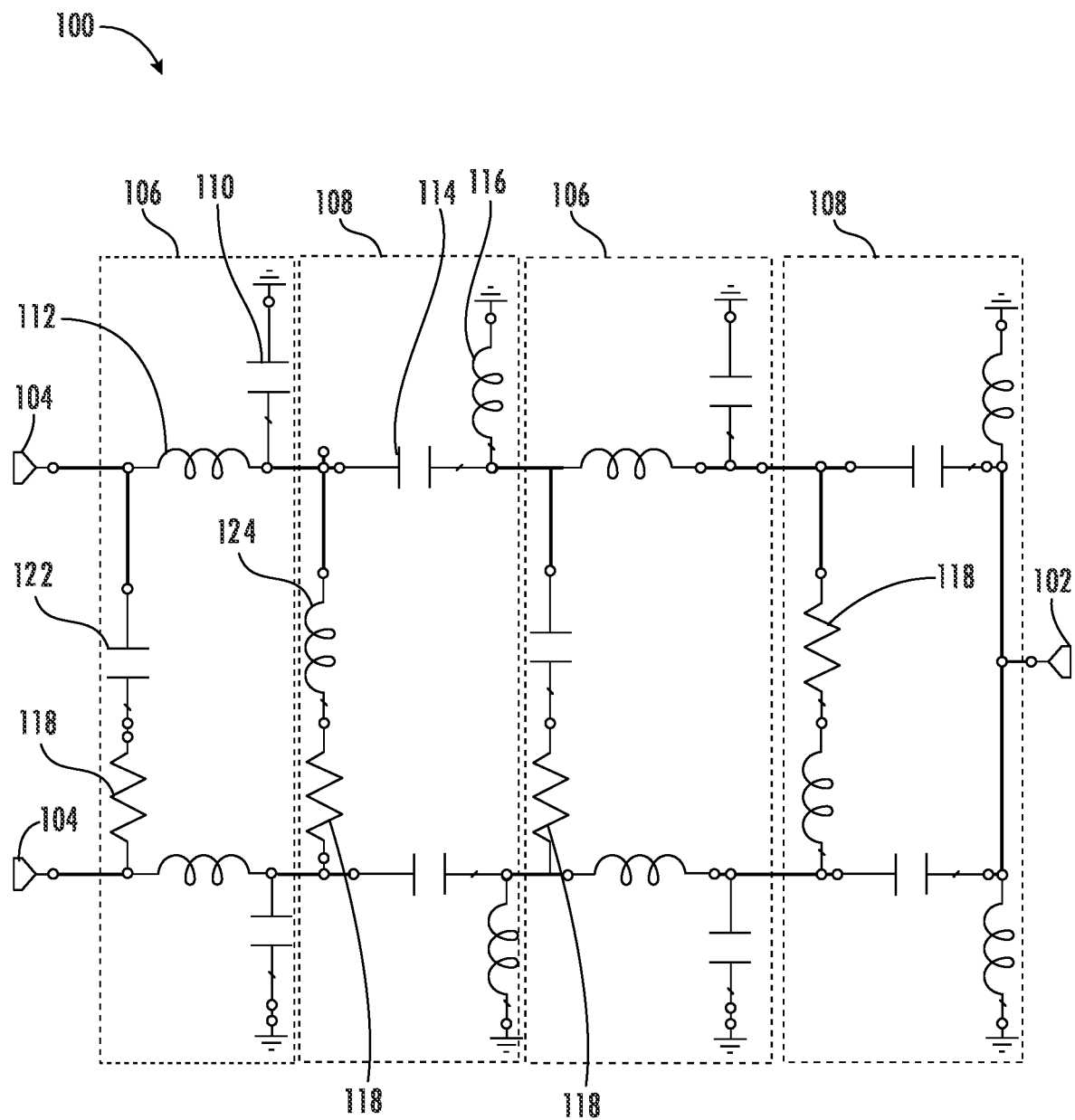
FIG. 1 illustrates a schematic view of an example power splitter in accordance with one or more embodiments of the present disclosure.
Figure 2:
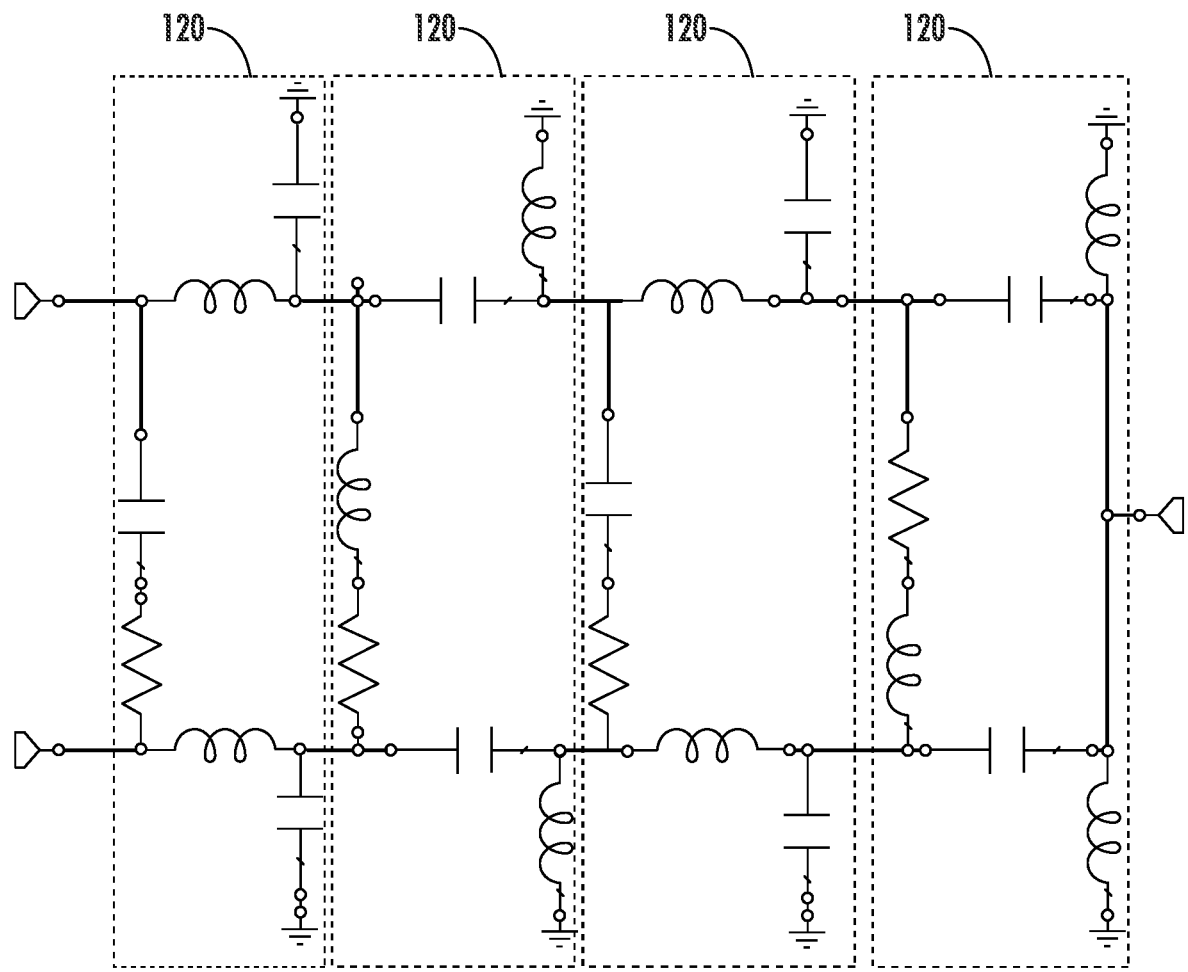
FIG. 2 illustrates another schematic view of the example power splitter in accordance with one or more embodiments of the present disclosure.

Example embodiments will be described more fully hereinafter with reference to the accompanying drawings, in which some, but not all embodiments of disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Overview

Example embodiments disclosed herein address technical problems associated with power splitters (e.g., power dividers and/or power combiners). As would be understood by one skilled in the field to which this disclosure pertains, there are numerous example scenarios in which a user may use power splitters.

In many applications, it is often necessary to use power splitters. For example, in electrical applications (e.g., radio frequency (RF) and microwave circuits), a power splitter may be used to split an input signal into two or more output signals (e.g., a power divider). As another example, in electrical applications (e.g., RF and microwave circuits), a power splitter can be used to combine two or more input signals into one output signal (e.g., a power combiner).

An example solution for a power splitter includes, for example, constructing a power splitter out of transmission lines. For example, a transmission line-based power splitter may include a quarter wavelength transmission line between a first port and a second port and another quarter wavelength transmission line between the first port and a third port. A transmission line-based power splitter may be able to provide a wide bandwidth. However, to obtain wide bandwidth with a transmission line-based power splitter, numerous transmission lines are needed (e.g., to obtain a wide bandwidth multiple quarter wavelength transmission lines are needed between the first port and the second port and multiple quarter wavelength transmission lines are needed between the first port and the third port). Thus, a transmission line-based power splitter with a wide bandwidth has a large size. As a result, in many applications transmission line-based power splitters are impractical and/or increase costs since transmission-line based power splitters either have wide bandwidth and are large in size or have narrow bandwidth and are small in size.

Another example solution for a power splitter includes, for example, constructing a power splitter out of low pass (e.g., at least one shunt capacitor and at least one series inductor) lumped elements or high pass (e.g., at least one series capacitor and at least one shunt inductor) lumped elements. For example, a lumped element-based power splitter may use low pass elements (e.g., a lumped element equivalent of a transmission line, such as a pi network) between the first port and the second port and low pass elements between the first port and the third port (e.g., a lumped element equivalent of a transmission line, such as a pi network). A lumped element-based power splitter (e.g., one constructed out of low pass elements, or one constructed out of high pass elements) is typically smaller in size than a transmission line-based power splitter. However, a lumped element-based power splitter typically includes a large number of components (e.g., a large number of all low pass elements of shunt capacitors and series inductors or all high pass elements of series capacitors and shunt inductors) and has a smaller bandwidth than a power splitter constructed out of the transmission lines. As a result, in many applications lumped element-based power splitters are impractical and/or increase costs due to the inability to obtain a wide bandwidth and/or the large number of components needed. Accordingly, there is a need for a power splitter that is small in size, uses few components, and provides a wide bandwidth.

Thus, to address these and/or other issues related to power splitters, an example power splitter and associated methods are disclosed herein. For example, an embodiment in this disclosure, described in greater detail below, includes a power splitter having a first port and a plurality of second ports. In some examples, the power splitter may include one or more high pass elements with each of the one or more high pass elements having at least one series capacitor and at least one shunt inductor. In some examples, the power splitter may include one or more low pass elements, with each of the one or more low pass elements having at least one series inductor and at least one shunt capacitor. In some examples, by using both high pass and low pass elements, the power splitter may be capable of having greater bandwidth, a smaller size, and/or fewer components than a conventional lumped element-based power splitter (e.g., one that uses only low pass elements or only high pass elements) and/or a transmission line-based power splitter.

Example Power Splitter

With reference to FIGS. 1-4, embodiments herein provide for an example power splitter 100.

In some embodiments, the power splitter 100 may include a first port 102. In some embodiments, the first port 102 may be configured to receive a signal (e.g., into the power splitter 100). For example, the first port 102 may be configured to receive a signal into the power splitter 100 from one or more other electrical circuit components, such as radio frequency (RF) and/or microwave circuit components. Additionally or alternatively, the first port 102 may be configured to output a signal (e.g., out of the power splitter 100). For example, the first port 102 may be configured to output a signal from the power splitter 100 to one or more other electrical circuit components, such as RF and/or microwave circuit components.

In some embodiments, the power splitter 100 may include a plurality of second ports 104. In some embodiments, each of the plurality of second ports 104 may be configured to receive a signal (e.g., into the power splitter 100). For example, each of the plurality of second ports 104 may be configured to receive a signal into the power splitter 100 from one or more other electrical circuit components, such as radio frequency (RF) and/or microwave circuit components. Additionally or alternatively, each of the plurality of second ports 104 may be configured to output a signal (e.g., out of the power splitter 100). For example, each of plurality of second ports 104 may be configured to output a signal from the power splitter 100 to one or more other electrical circuit components, such as radio frequency (RF) and/or microwave circuit components. Although the power splitter 100 depicted in FIGS. 1-4 includes two second ports 104, it would be understood by one skilled in the field to which this disclosure pertains that the power splitter 100 may have more than two second ports 104. For example, the power splitter 100 may include four second ports 104 each configured to receive a signal into the power splitter 100 (e.g., the power splitter 100 receives 4 signals) from one or more other electrical circuit components, such as RF and/or microwave circuit components. As another example, the power splitter 100 may include four second ports 104 each configured to output a signal from the power splitter 100 (e.g., the power splitter 100 outputs 4 signals) to one or more other electrical circuit components, such as RF and/or microwave circuit components.

In some embodiments, the first port 102 may be configured to receive an input signal and each of the plurality of second ports 104 may be configured to output a plurality of output signals based on the input signal (e.g., the power splitter 100 is configured to be a power divider). Said differently, the power splitter 100 may be configured to receive an input signal via the first port 102, divide the input signal into a plurality of output signals, and output the plurality of output signals via the plurality of second ports 104. For example, if the power splitter 100 has two second ports 104, the power splitter 100 may be configured to receive an input signal via the first port 102, divide the input signal into two output signals, and output each output signal via the two second ports 104.

In some embodiments, the plurality of second ports 104 may be configured to receive a plurality of input signals and the first port 102 may be configured to output a combined signal based on the plurality of input signals (e.g., the power splitter 100 is configured to be a power combiner). Said differently, the power splitter 100 may be configured to receive a plurality of input signals via the plurality of second ports 104, combine the plurality of input signals into a combined signal, and output the combined signal via the first port 102. For example, if the power splitter 100 has two second ports 104, the power splitter 100 may be configured to receive two input signals via the two second ports 104, combine the two input signals into a combined signal, and output the combined signal via the first port 102.

In some embodiments, the power splitter 100 may be configured to be cascaded with other power splitters. In this regard, for example, the first port 102 may be configured to be connected to an output port of another power splitter (e.g., the first port 102 may receive an input signal that was outputted from another power splitter). As another example, the first port 102 may be configured to be connected to an input port of another power splitter (e.g., the first port 102 may output an output signal as an input signal to another power splitter). As another example, each of the second ports 104 may be configured to be connected to an output port of another power splitter (e.g., each of the second ports 104 receives an input signal that was outputted from another power splitter). As another example, each of the second ports 104 may be configured to be connected to an input port of another power splitter (e.g., each of the second ports 104 may output an output signal as an input signal to another power splitter).

In some embodiments, the power splitter 100 may include one or more low pass elements 106. In some embodiments, each of the one or more low pass elements 106 may include at least one shunt capacitor 110 and at least one series inductor 112 (e.g., each of the one or more low pass elements 106 includes at least one shunt capacitor 110 and at least one series inductor 112 pair). In some embodiments, one or more of the low pass elements 106 may comprise monolithic microwave integrated circuits (e.g., monolithic microwave integrated circuits may be used for higher frequency bands). In some embodiments, the power splitter 100 may include one or more high pass elements 108. In some embodiments, each of the one or more high pass elements 108 may include at least one series capacitor 114 and at least one shunt inductor 116 (e.g., each of the one or more high pass elements 108 includes at least one series capacitor 114 and at least one shunt inductor 116 pair). In some embodiments, one or more of the high pass elements 108 may comprise monolithic microwave integrated circuits. In some embodiments, by using both low pass elements 106 and high pass elements 108, the power splitter 100 may have a wider bandwidth and use fewer components than a lumped element-based power splitter that uses only low pass elements or only high pass elements. In some embodiments, by using both low pass elements 106 and high pass elements 108, the power splitter 100 may have wider bandwidth and be smaller in size than a transmission line-based power splitter.

Although the power splitter 100 depicted in FIGS. 1-4 depicts a lumped element-based power splitter (e.g., the depicted power splitter 100 includes at least one shunt capacitor 110, at least one series inductor 112, at least one series capacitor 114, and at least one shunt inductor 116), it would be understood by one skilled in the field to which this disclosure pertains that one or more of the lumped circuit elements in the power splitter 100 may be replaced by one or more transmission lines. For example, one or more of the lumped circuit elements in the power splitter 100 may be replaced by one or transmission lines for higher frequency bands.

In some embodiments, each of the one or more low pass elements 106 may be in electrical communication with the first port 102 and/or the plurality of second ports 104. In some embodiments, at least one of the one or more low pass elements 106 may be proximate the first port 102. Said differently, at least one of the one or more low pass elements 106 may be the first of the one or more low pass elements 106 and/or the first of the one or more high pass elements 108 connected to the first port 102. Additionally or alternatively, at least one of the one or more low pass elements 106 may be proximate at least one of the plurality of second ports 104. Said differently, at least one of the one or more low pass elements 106 is the first of the one or more low pass elements 106 and/or the first of the one or more high pass elements 108 connected to the plurality of second ports 104.

In some embodiments, each of the one or more high pass elements 108 may be in electrical communication with the first port 102 and/or the plurality of second ports 104. In some embodiments, at least one of the one or more high pass elements 108 may be proximate the first port 102. Said differently, at least one of the one or more high pass elements 108 is the first of the one or more low pass elements 106 and/or the first of the one or more high pass elements 108 connected to the first port 102. Additionally or alternatively, at least one of the one or more high pass elements 108 may be proximate at least one of the plurality of second ports 104. Said differently, at least one of the one or more high pass elements 108 is the first of the one or more low pass elements 106 and/or the first of the one or more high pass elements 108 connected to the plurality of second ports 104.

In some embodiments, the power splitter 100 may include an equal number of low pass elements 106 and high pass elements 108. For example, the power splitter 100 may have two low pass elements 106 and two high pass elements 108. In some embodiments, the power splitter 100 may have more low pass elements 106 than high pass elements 108. For example, the power splitter 100 may have three low pass elements 106 and two high pass elements 108. In some embodiments, the power splitter 100 may have less low pass elements 106 than high pass elements 108. For example, the power splitter 100 may have one low pass element 106 and two high pass elements 108.

In some embodiments, the power splitter 100 may include one more sections 120. In this regard, the power splitter 100 may have from 1 to N sections 120. For example, the power splitter 100 as depicted in FIGS. 1-4 has four sections 120. In some embodiments, each section 120 may be associated with one or more low pass elements 106 and/or one or more high pass elements 108. For example, in some embodiments, each section 120 may have only low pass elements 106 or only high pass elements 108. In this regard, for example, the low pass elements 106 and the high pass elements 108 may be alternated. Said differently, a section 120 having only low pass elements 106 may be next to a section 120 having only high pass elements 108 and vice versa. As another example, some or all of the sections 120 may have both low pass elements 106 and high pass elements 108. In some embodiments, each section 120 may include one or more low pass elements 106 for the even mode network and/or the odd mode network. In some embodiments, each section 120 may include one or more high pass elements 108 for the even mode network and/or the odd mode network.

In some embodiments, the bandwidth of the power splitter 100 may be based at least in part on the number of sections 120 in the power splitter 100 (e.g., the number of high pass elements 108 and/or the number of low pass elements 106 in the power splitter 100). For example, in some embodiments, the power splitter 100 may have more sections 120 to increase the bandwidth of the power splitter 100. In this regard, for example, a power splitter 100 with between 4 and 8 sections may have a bandwidth of approximately 2 GHz to 18 GHz and a power splitter 100 with 2 sections may have a bandwidth of approximately 6 GHz to 12 GHz (e.g., the bandwidth may be wider when the power splitter 100 has more sections 120). In some embodiments, the power splitter 100 may have fewer sections 120 to decrease the size of the power splitter 100, and the number of components in the power splitter 100. For example, a power splitter 100 with 5 sections 120 may be larger and have more components than a power splitter 100 with 3 sections 120. In some embodiments, the power splitter 100 may be associated with a bandwidth ratio between 3 to 1 and 10 to 1 (e.g., the bandwidth ratio being the ratio between an upper frequency of the bandwidth and a lower frequency of the bandwidth).

In some embodiments, the power splitter 100 may include one or more resistors 118. In some embodiments, the power splitter 100 may include a number of resistors 118 equal to the number of low pass elements 106 and the number of high pass elements 108. For example, the power splitter 100 may include four resistors 118 if the power splitter 100 has two low pass elements 106 and two high pass elements 108. In some embodiments, each of the one or more resistors 118 may be configured to isolate each of the plurality of second ports 104 from each other.

Figure 3:
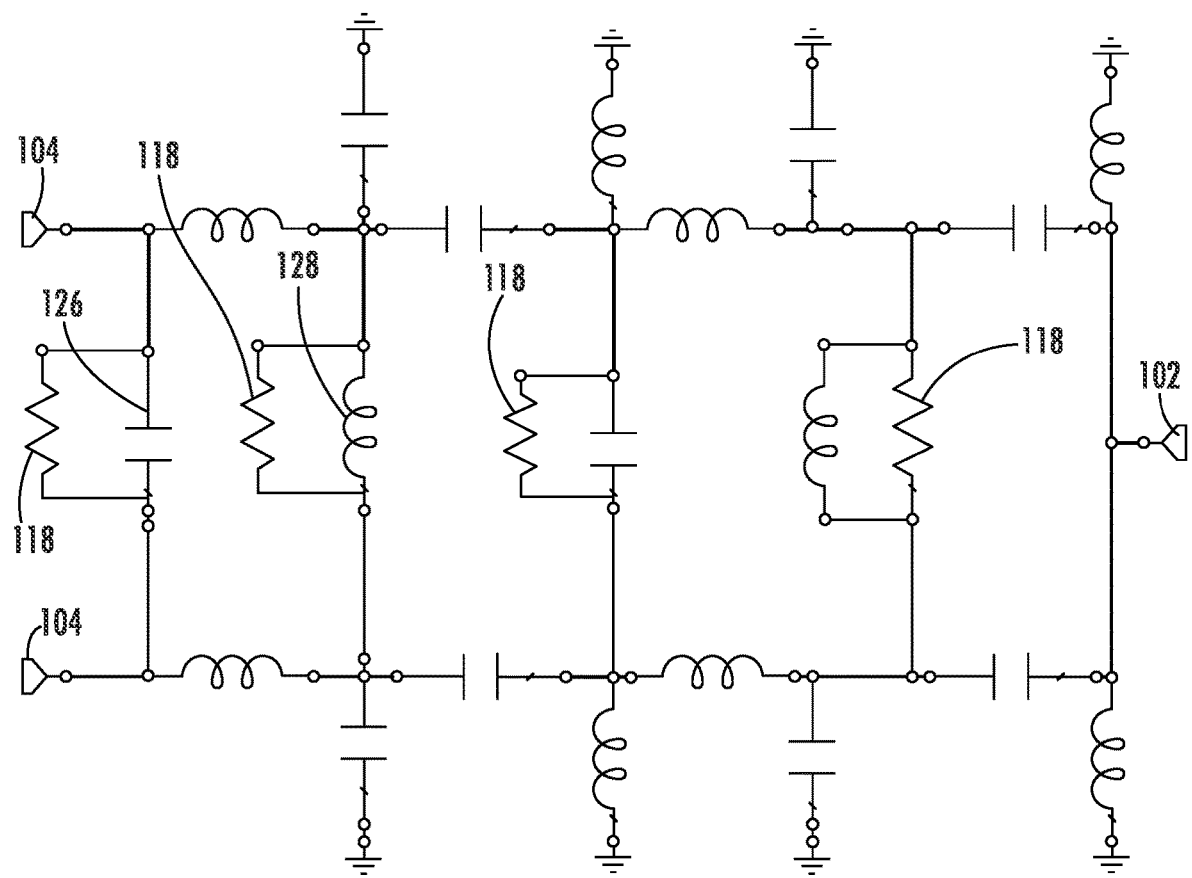
FIG. 3 illustrates another schematic view of the example power splitter in accordance with one or more embodiments of the present disclosure.

In some embodiments, such as depicted in FIG. 1, the one or more resistors 118 may each be in series with a capacitor 122 and/or in series with an inductor 124. In some embodiments, the one or more resistors 118 together with the capacitor 122 and/or the inductor 124 that the one or more resistors 118 are in series with may be configured to isolate each of the plurality of second ports 104 from each other (e.g., impedance isolation is provided). In some embodiments, such as depicted in FIG. 3, the one or more resistors 118 may each be in parallel with a capacitor 126 and/or in parallel with an inductor 128. In some embodiments, the one or more resistors 118 together with the capacitor 126 and/or the inductor 128 that the one or more resistors 118 are in parallel with may be configured to isolate each of the plurality of second ports 104 from each other (e.g., impedance isolation is provided).

In some embodiments, the power splitter 100 may be configured to filter an input signal received via the first port 102. For example, the power splitter 100 may be configured to filter components of the input signal outside of a frequency band (e.g., the power splitter 100 may also be a bandpass filter). In some embodiments, the low pass elements 106 may be configured to filter components of the input signal having a frequency lower than the frequency band. For example, if the frequency band is 2 GHz to 18 GHz, the low pass elements 106 may be configured to filter components of the input signal having a frequency less than 2 GHZ. In some embodiments, the high pass elements 108 may be configured to filter components of the input signal having a frequency higher than the frequency band. For example, if the frequency band is 2 GHz to 18 GHZ, the high pass elements 108 may be configured to filter components of the input signal having a frequency greater than 18 GHz.

In some embodiments, the power splitter 100 may be configured to filter a plurality of input signals received via the plurality of second ports 104. For example, the power splitter 100 may be configured to filter components of each of the plurality of input signals outside of a frequency band (e.g., the power splitter 100 may be a bandpass filter). In some embodiments, the low pass elements 106 may be configured to filter components of each of the plurality of input signals having a frequency lower than the frequency band. For example, if the frequency band is 2 GHz to 18 GHZ, the low pass elements 106 may be configured to filter components of each of the plurality of input signals having a frequency less than 2 GHZ. In some embodiments, the high pass elements 108 may be configured to filter components of each of the plurality of input signals having a frequency higher than the frequency band. For example, if the frequency band is 2 GHz to 18 GHZ, the high pass elements 108 may be configured to filter components of each of the plurality of input signals having a frequency greater than 18 GHz.

Example Method of Manufacturing a Power Splitter

Figure 4:
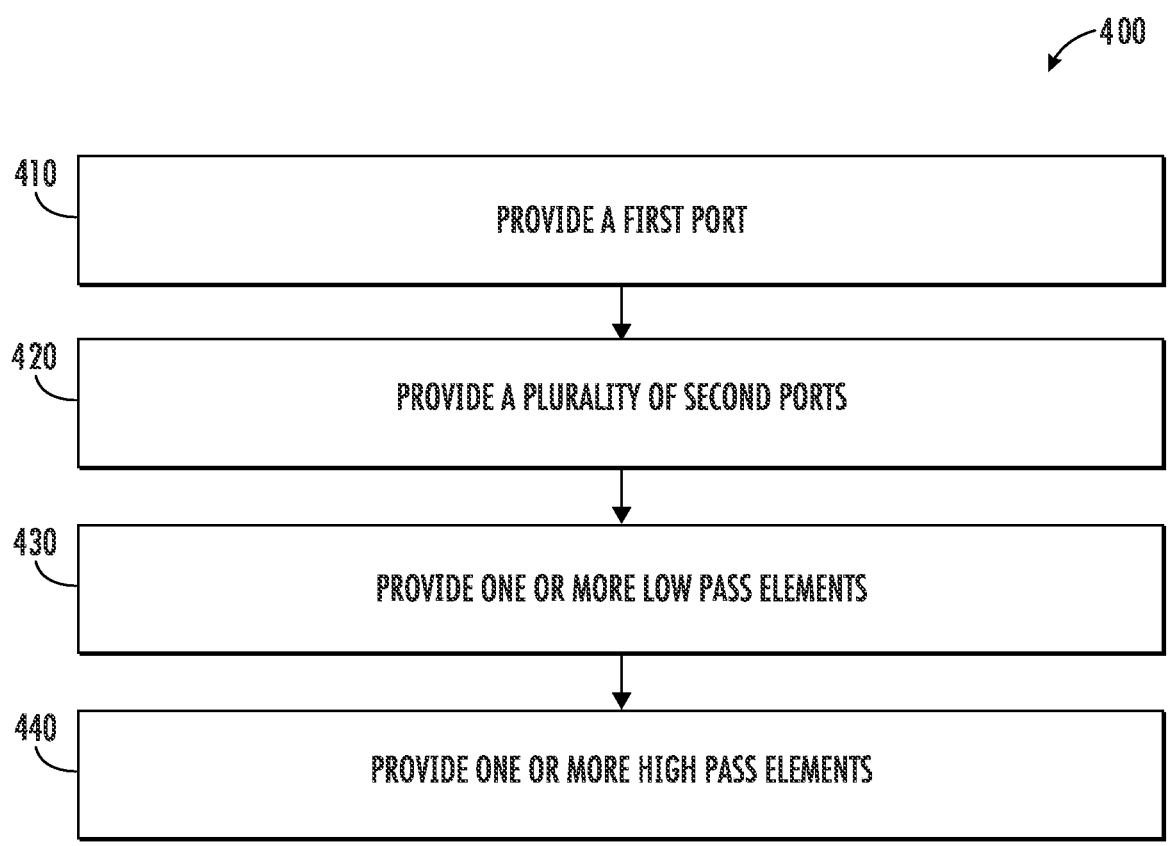
FIG. 4 illustrates a flowchart of an example method of manufacturing a power splitter in accordance with one or more embodiments of the present disclosure.

Referring now to FIG. 4, a flowchart providing an example method 400 of manufacturing a power splitter is illustrated.

As shown in block 410, the method 400 may include providing a first port. As described above, in some embodiments, the first port may be configured to receive a signal (e.g., into the power splitter). Additionally or alternatively, the first port may be configured to output a signal (e.g., out of the power splitter).

As shown in block 420, the method 400 may include providing a plurality of second ports. As described above, in some embodiments, each of the plurality of second ports may be configured to receive a signal (e.g., into the power splitter). Additionally or alternatively, each of the plurality of second ports may be configured to output a signal (e.g., out of the power splitter). In some embodiments, the first port may be configured to receive an input signal and each of the plurality of second ports may be configured to output a plurality of output signals based on the input signal (e.g., the power splitter is configured to be a power divider). Said differently, the power splitter may be configured to receive an input signal via the first port, divide the input signal into a plurality of output signals, and output the plurality of output signals via the plurality of second ports. In some embodiments, the plurality of second ports may be configured to receive a plurality of input signals and the first port may be configured to output a combined signal based on the plurality of input signals (e.g., the power splitter is configured to be a power combiner). Said differently, the power splitter may be configured to receive a plurality of input signals via the plurality of second ports, combine the plurality of input signals into a combined signal, and output the combined signal via the first port.

As shown in block 430, the method 400 may include providing one or more low pass elements. In some embodiments, each of the one or more low pass elements may include at least one shunt capacitor and at least one series inductor (e.g., each of the one or more low pass elements includes at least one shunt capacitor and at least one series inductor pair). In some embodiments, each of the one or more low pass elements may be in electrical communication with the first port and/or the plurality of second ports. In some embodiments, at least one of the one or more low pass elements may be proximate the first port. Additionally or alternatively, at least one of the one or more low pass elements may be proximate at least one of the plurality of second ports.

As shown in block 440, the method 400 may include providing one or more high pass elements. In some embodiments, the power splitter may include one or more high pass elements. In some embodiments, each of the one or more high pass elements may include at least one series capacitor and at least one shunt inductor (e.g., each of the one or more high pass elements includes at least one series capacitor and at least one shunt inductor pair). In some embodiments, by using both low pass elements and high pass elements, the power splitter may have a wider bandwidth and use less components than a lumped element-based power splitter that uses only low pass elements or only high pass elements. In some embodiments, by using both low pass elements and high pass elements, the power splitter may have wider bandwidth and be smaller in size than a transmission line-based power splitter. In some embodiments, each of the one or more high pass elements may be in electrical communication with the first port and/or the plurality of second ports. In some embodiments, at least one of the one or more high pass elements may be proximate the first port. Additionally or alternatively, at least one of the one or more high pass elements may be proximate at least one of the plurality of second ports. In some embodiments, the power splitter may include an equal number of low pass elements and high pass elements.

Example Method

Figure 5:
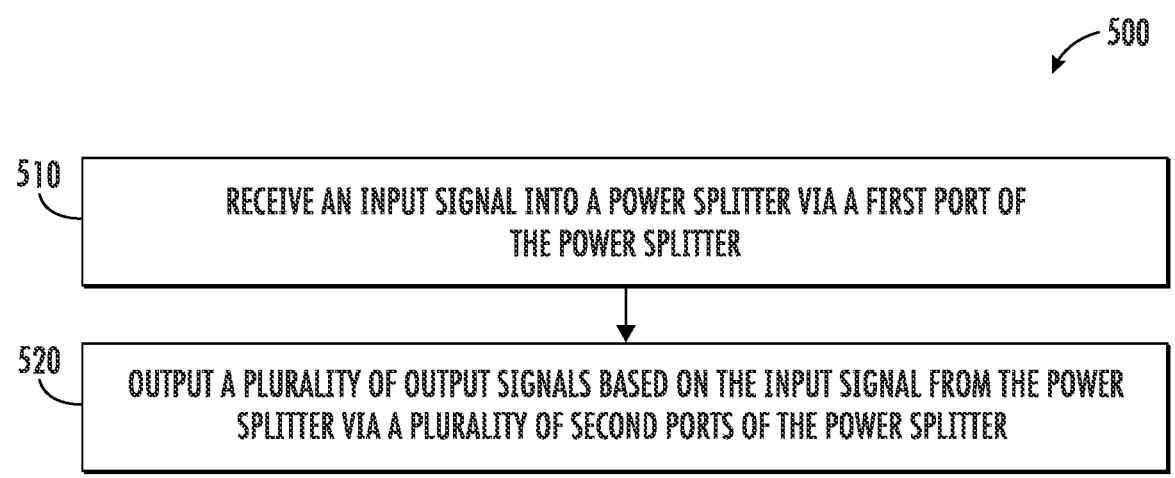
FIG. 5 illustrates a flowchart of an example method in accordance with one or more embodiments of the present disclosure.

Referring now to FIG. 5, a flowchart providing an example method 500 is illustrated.

As shown in block 510, the method 500 may include receiving an input signal into a power splitter via a first port of the power splitter. As described above, in some embodiments, the first port may be configured to receive a signal (e.g., into the power splitter).

As shown in block 520, the method 500 may include outputting a plurality of output signals based on the input signal from the power splitter via a plurality of second ports of the power splitter. As described above, each of the plurality of second ports may be configured to output a signal (e.g., out of the power splitter). In some embodiments, the first port may be configured to receive an input signal and each of the plurality of second ports may be configured to output a plurality of output signals based on the input signal (e.g., the power splitter is configured to be a power divider). Said differently, the power splitter may be configured to receive an input signal via the first port, divide the input signal into a plurality of output signals, and output the plurality of output signals via the plurality of second ports.

As described above, the power splitter may include one or more low pass elements. In some embodiments, each of the one or more low pass elements may include at least one shunt capacitor and at least one series inductor (e.g., each of the one or more low pass elements includes at least one shunt capacitor and at least one series inductor pair). In some embodiments, each of the one or more low pass elements may be in electrical communication with the first port and/or the plurality of second ports. In some embodiments, at least one of the one or more low pass elements may be proximate the first port. Additionally or alternatively, at least one of the one or more low pass elements may be proximate at least one of the plurality of second ports.

As described above, the power splitter may include one or more high pass elements. In some embodiments, each of the one or more high pass elements may include at least one series capacitor and at least one shunt inductor (e.g., each of the one or more high pass elements includes at least one series capacitor and at least one shunt inductor pair). In some embodiments, by using both low pass elements and high pass elements, the power splitter may have a wider bandwidth and use less components than a lumped element-based power splitter that uses only low pass elements or only high pass elements. In some embodiments, by using both low pass elements and high pass elements, the power splitter may have wider bandwidth and be smaller in size than a transmission line-based power splitter. In some embodiments, each of the one or more high pass elements may be in electrical communication with the first port and/or the plurality of second ports. In some embodiments, at least one of the one or more high pass elements may be proximate the first port. Additionally or alternatively, at least one of the one or more high pass elements may be proximate at least one of the plurality of second ports. In some embodiments, the power splitter may include an equal number of low pass elements and high pass elements.

Example Method

Figure 6:
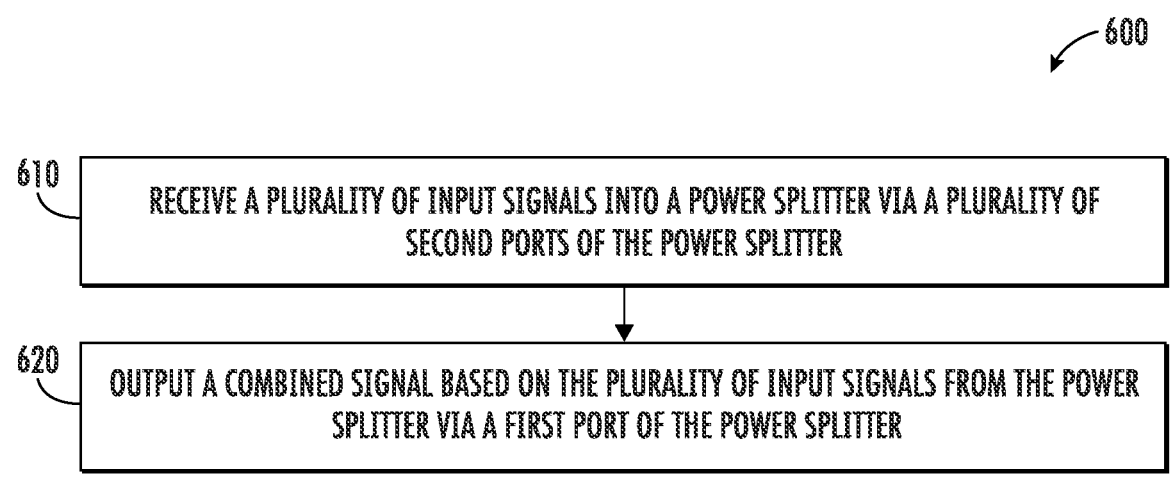
FIG. 6 illustrates a flowchart of an example method in accordance with one or more embodiments of the present disclosure.

Referring now to FIG. 6, a flowchart providing an example method 600 is illustrated.

As shown in block 610, the method 600 may include receiving a plurality of input signals into a power splitter via a plurality of second ports of the power splitter. As described above, in some embodiments, each of the plurality of second ports may be configured to receive a signal (e.g., into the power splitter).

As shown in block 620, the method 600 may include outputting a combined signal based on the plurality of input signals from the power splitter via a first port of the power splitter. As described above, in some embodiments, the plurality of second ports may be configured to receive a plurality of input signals and the first port may be configured to output a combined signal based on the plurality of input signals (e.g., the power splitter is configured to be a power combiner). Said differently, the power splitter may be configured to receive a plurality of input signals via the plurality of second ports, combine the plurality of input signals into a combined signal, and output the combined signal via the first port.

As described above, the power splitter may include one or more low pass elements. In some embodiments, each of the one or more low pass elements may include at least one shunt capacitor and at least one series inductor (e.g., each of the one or more low pass elements includes at least one shunt capacitor and at least one series inductor pair). In some embodiments, each of the one or more low pass elements may be in electrical communication with the first port and/or the plurality of second ports. In some embodiments, at least one of the one or more low pass elements may be proximate the first port. Additionally or alternatively, at least one of the one or more low pass elements may be proximate at least one of the plurality of second ports.

As described above, the power splitter may include one or more high pass elements. In some embodiments, each of the one or more high pass elements may include at least one series capacitor and at least one shunt inductor (e.g., each of the one or more high pass elements includes at least one series capacitor and at least one shunt inductor pair). In some embodiments, by using both low pass elements and high pass elements, the power splitter may have a wider bandwidth and use less components than a lumped element-based power splitter that uses only low pass elements or only high pass elements. In some embodiments, by using both low pass elements and high pass elements, the power splitter may have wider bandwidth and be smaller in size than a transmission line-based power splitter. In some embodiments, each of the one or more high pass elements may be in electrical communication with the first port and/or the plurality of second ports. In some embodiments, at least one of the one or more high pass elements may be proximate the first port. Additionally or alternatively, at least one of the one or more high pass elements may be proximate at least one of the plurality of second ports. In some embodiments, the power splitter may include an equal number of low pass elements and high pass elements.

Many modifications and other embodiments of the inventions set forth herein will come to mind to one skilled in the art to which these inventions pertain having the benefit of teachings presented in the foregoing descriptions and the associated drawings. Although the figures only show certain components of the apparatus and systems described herein, it is understood that various other components may be used in conjunction with the system. Therefore, it is to be understood that the inventions are not to be limited to the specific embodiments disclosed and that modifications and other embodiments are intended to be included within the scope of the appended claims. Moreover, the steps in the method described above may not necessarily occur in the order depicted in the accompanying diagrams, and in some cases one or more of the steps depicted may occur substantially simultaneously, or additional steps may be involved. Although specific terms are employed herein, they are used in a generic and descriptive sense only and not for purposes of limitation.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

That which is claimed:

1. A power splitter/combiner, the power splitter/combiner comprising:
    a first port;
    a plurality of second ports;
    one or more low pass elements, wherein each of the one or more low pass elements comprises at least one series inductor and at least one shunt capacitor, wherein each of the one or more low pass elements is electrically connected to the first port and the plurality of second ports, wherein each of the one or more low pass elements comprises a low pass isolation circuit configured to isolate the plurality of second ports and comprising a first resistor in series with a capacitor; and
    one or more high pass elements, wherein each of the one or more high pass elements comprises at least one series capacitor and at least one shunt inductor, wherein each of the one or more high pass elements is electrically connected to the first port and the plurality of second ports, wherein each of the one or more high pass elements comprises a high pass isolation circuit configured to isolate the plurality of second ports and comprising a second resistor in series with an inductor.

2. The power splitter/combiner of claim 1, wherein the first port is configured to receive an input signal and each of the plurality of second ports is configured to output a plurality of output signals based on the input signal.

3. The power splitter/combiner of claim 1, wherein the plurality of second ports is configured to receive a plurality of input signals and the first port is configured to output a combined signal based on the plurality of input signals.

4. The power splitter/combiner of claim 1, wherein a number of high pass elements is equal to a number of low pass elements.

5. The power splitter/combiner of claim 1, wherein a number of high pass elements is greater than a number of low pass elements.

6. The power splitter/combiner of claim 1, wherein a number of high pass elements is less than a number of low pass elements.

7. The power splitter/combiner of claim 1, wherein a bandwidth of the power splitter/combiner is based at least in part on a number of high pass elements and a number of low pass elements.

8. The power splitter/combiner of claim 1, wherein the one or more high pass elements and the one or more low pass elements comprise monolithic microwave integrated circuits.

9. The power splitter/combiner of claim 1, wherein at least one of the one or more high pass elements is proximate with the first port and at least one of the one or more low pass elements is proximate with at least one of the plurality of second ports.

10. The power splitter/combiner of claim 1, wherein at least one of the one or more low pass elements is proximate with the first port and at least one of the one or more high pass elements is proximate with at least one of the plurality of second ports.

11. The power splitter/combiner of claim 1, wherein a bandwidth ratio of the power splitter/combiner is between 5 to 1 and 10 to 1.

12. The power splitter/combiner of claim 1, where at least one of the one or more low pass elements comprises a transmission line and at least one of the one or more high pass elements comprises a monolithic microwave integrated circuit.

13. The power splitter/combiner of claim 1, further comprising:
    a second low pass element, wherein at least one of the one or more low pass elements corresponds to an even mode network and the second low pass element corresponds to an odd mode network; and
    a second high pass element, wherein at least one of the one or more high pass elements corresponds to the even mode network and the second high pass element corresponds to the odd mode network.

14. A method comprising:
    receiving an input signal into a power splitter/combiner via a first port of the power splitter/combiner; and
    outputting a plurality of output signals based on the input signal from the power splitter/combiner via a plurality of second ports of the power splitter/combiner, wherein the power splitter/combiner comprises:
        one or more low pass elements, wherein each of the one or more low pass elements comprises at least one series inductor and at least one shunt capacitor, wherein each of the one or more low pass elements is electrically connected to the first port and the plurality of second ports, wherein each of the one or more low pass elements comprises a low pass isolation circuit configured to isolate the plurality of second ports and comprising a first resistor in series with a capacitor; and one or more high pass elements, wherein each of the one or more high pass elements comprises at least one series capacitor and at least one shunt inductor, wherein each of the one or more high pass elements is electrically connected to the first port and the plurality of second ports, wherein each of the one or more high pass elements comprises a high pass isolation circuit configured to isolate the plurality of second ports and comprising a second resistor in series with an inductor.

15. The method of claim 14, wherein at least one of the one or more high pass elements is proximate the first port and at least one of the one or more low pass elements is proximate at least one of the plurality of second ports or at least one of the one or more low pass elements is proximate the first port and at least one of the one or more high pass elements is proximate at least one of the plurality of second ports.

16. The method of claim 14, wherein a number of high pass elements is equal to a number of low pass elements.

17. The method of claim 14, wherein a number of high pass elements is greater than a number of low pass elements or a number of high pass elements is less than a number of low pass elements.

18. The method of claim 14, wherein a bandwidth of the power splitter/combiner is based at least in part on a number of high pass elements and a number of low pass elements.

19. A method comprising:
receiving a plurality of input signals into a power splitter/combiner via a plurality of second ports of the power splitter/combiner; and
outputting a combined signal based on the plurality of input signals from the power splitter/combiner via a first port of the power splitter/combiner, wherein the power splitter/combiner comprises:
one or more low pass elements, wherein each of the one or more low pass elements comprises at least one series inductor and at least one shunt capacitor, wherein each of the one or more low pass elements is electrically connected to the first port and the plurality of second ports, wherein each of the one or more low pass elements comprises a low pass isolation circuit configured to isolate the plurality of second ports and comprising a first resistor in series with a capacitor; and
one or more high pass elements, wherein each of the one or more high pass elements comprises at least one series capacitor and at least one shunt inductor, wherein each of the one or more high pass elements is electrically connected to the first port and the plurality of second ports, wherein each of the one or more high pass elements comprises a high pass isolation circuit configured to isolate the plurality of second ports and comprising a second resistor in series with an inductor.

20. The method of claim 19, wherein at least one of the one or more high pass elements is proximate with the first port and at least one of the one or more low pass elements is proximate with at least one of the plurality of second ports or at least one of the one or more low pass elements is proximate with the first port and at least one of the one or more high pass elements is proximate at least one of the plurality of second ports.

* * * * *